(12) United States Patent
Nguyen et al.

(10) Patent No.: US 8,698,320 B2
(45) Date of Patent: Apr. 15, 2014

(54) CURABLE RESIN COMPOSITIONS USEFUL AS UNDERFILL SEALANTS FOR USE WITH LOW-K DIELECTRIC-CONTAINING SEMICONDUCTOR DEVICES

(75) Inventors: My Nhu Nguyen, Poway, CA (US); Puwei Liu, San Diego, CA (US)

(73) Assignee: Henkel IP & Holding GmbH, Duesseldorf (DE)

( * ) Notice: Subject to any disclaimer, the term of this patent is extended or adjusted under 35 U.S.C. 154(b) by 207 days.

(21) Appl. No.: 12/632,091

(22) Filed: Dec. 7, 2009

(65) Prior Publication Data

US 2011/0133344 A1    Jun. 9, 2011

(51) Int. Cl.
*H01L 23/18*    (2006.01)
*H01L 21/56*    (2006.01)
*C08L 63/10*    (2006.01)

(52) U.S. Cl.
USPC ............................ 257/776; 523/427; 438/125

(58) Field of Classification Search
USPC ............................ 523/427; 257/776; 438/125
See application file for complete search history.

(56) References Cited

U.S. PATENT DOCUMENTS

| | | |
|---|---|---|
| 3,154,597 A | 10/1964 | McWhorter |
| 4,477,629 A | 10/1984 | Hefner, Jr. |
| 4,528,366 A | 7/1985 | Woo et al. |
| 5,037,885 A | 8/1991 | Mori et al. |
| 5,140,404 A | 8/1992 | Fogal et al. |
| 5,173,544 A | 12/1992 | Shimizu et al. |
| 5,286,679 A | 2/1994 | Farnworth et al. |
| 5,323,060 A | 6/1994 | Fogal et al. |
| 5,447,988 A | 9/1995 | Dershem et al. |
| 5,470,622 A | 11/1995 | Rinde et al. |
| 5,840,806 A | 11/1998 | Komazaki et al. |
| 5,991,493 A | 11/1999 | Dawes et al. |
| 6,034,194 A | 3/2000 | Dershem et al. |
| 6,211,320 B1 | 4/2001 | Dershem et al. |
| 6,225,418 B1 | 5/2001 | Satsu et al. |
| 6,387,990 B1 | 5/2002 | Yeager |
| 6,432,613 B1 | 8/2002 | Chen |
| 6,465,893 B1 | 10/2002 | Khandros et al. |
| 6,521,731 B2 | 2/2003 | Dershem et al. |
| 6,613,839 B1 | 9/2003 | Gan et al. |
| 6,762,511 B2 | 7/2004 | Satsu et al. |
| 6,821,657 B1 | 11/2004 | Takahashi et al. |
| 6,946,198 B2 | 9/2005 | Takahashi et al. |
| 7,112,634 B2 | 9/2006 | Satsu et al. |
| 7,162,110 B2 | 1/2007 | Kohinata et al. |
| 7,176,044 B2 | 2/2007 | Forray et al. |
| 7,312,534 B2 | 12/2007 | Delos Santos et al. |
| 7,682,691 B2 | 3/2010 | Akaho et al. |
| 7,691,475 B2 | 4/2010 | Larson et al. |
| 7,926,697 B2 | 4/2011 | Shekhawat et al. |
| 2002/0086239 A1 | 7/2002 | Chen et al. |
| 2003/0118835 A1 | 6/2003 | Jayaraman |
| 2007/0282081 A1 | 12/2007 | Ichiroku |
| 2008/0036097 A1* | 2/2008 | Ito et al. ........................ 257/778 |

FOREIGN PATENT DOCUMENTS

| | | |
|---|---|---|
| GB | 1 305 702 | 2/1973 |
| JP | 8169935 | 7/1996 |
| JP | 2004189815 A | 7/2004 |
| JP | 2005232384 | 9/2005 |
| JP | 2006-291098 | 10/2006 |
| JP | 2008244351 | 10/2008 |
| WO | WO 85/02184 | 5/1985 |
| WO | 2006090794 | 8/2006 |
| WO | WO 2007/075718 | 7/2007 |
| WO | WO 2007/075769 | 7/2007 |

OTHER PUBLICATIONS

Gelest Silane Coupling Agents. 2006.*
Partial International Search Report issued for International Patent Application No. PCT/US2009/037246 mailed Oct. 29, 2009.

* cited by examiner

*Primary Examiner* — John Uselding
(74) *Attorney, Agent, or Firm* — Steven C. Bauman

(57) ABSTRACT

This invention relates to thermosetting resin compositions useful for flip chip ("FC") underfill sealant materials, where a semiconductor chip is mounted directly onto a circuit through solder electrical interconnections. Similarly, the compositions are useful for mounting onto a circuit board semiconductor devices, such as chip size or chip scale packages ("CSPs"), ball grid arrays ("BGAs"), land grid arrays ("LGAs") and the like, each of which having a semiconductor chip, such as large scale integration ("LSI"), on a carrier substrate.

17 Claims, 3 Drawing Sheets

CURABLE RESIN COMPOSITIONS USEFUL AS UNDERFILL SEALANTS FOR USE WITH LOW-K DIELECTRIC-CONTAINING SEMICONDUCTOR DEVICES

BACKGROUND OF THE INVENTION

Field of the Invention

This invention relates to thermosetting resin compositions useful for flip chip ("FC") underfill sealant materials, where a semiconductor chip is mounted directly onto a circuit through solder electrical interconnections. Similarly, the compositions are useful for mounting onto a circuit board semiconductor devices, such as chip size or chip scale packages ("CSPs"), ball grid arrays ("BGAs"), land grid arrays ("LGAs") and the like, each of which having a semiconductor chip, such as large scale integration ("LSI"), on a carrier substrate.

BRIEF DESCRIPTION OF RELATED TECHNOLOGY

Low dielectric constant ("low-k") dielectric materials (or interlayer dielectric layers, "ILD's") continue play an important role in the future development of advanced integrated circuit manufacturing, enabling the use of copper interconnects in sub-0.18 micron fabrication processes. Low-k ILD's are used in integrated circuit manufacturing to insulate copper in integrated circuit manufacturing to insulate copper interconnects from their surroundings, ensuring less cross talk between interconnections. Cross talk is a common problem in integrated circuit manufacturing, as it causes malfunction in the circuit. Cross talk becomes even more pronounced as the size of the integrated circuit continues to shrink. The dielectric constant of conventional interlayer materials used in integrated circuit manufacturing ordinarily resides in the >3.0 range. However, with the continued increase in the density of inputs/outputs on a single chip, the cross talk concerns increase.

Thus, low-K ILD's having dielectric constants below about 2.5 are an important aspect of the design of integrated circuits to maximize the efficiency of ever more compact integrated circuits. One such material is known as Black Diamond, and is commercially available from Applied Materials.

Announcements within the industry indicating the trend to 0.09 micron, and even 0.065 micron, chip fabrication processes using low-k ILD's have been reported. Progress in that regard has been hampered to date, however, as chipmakers struggle with achieving acceptable package level reliability.

As the industry continues to seek advanced materials for circuit boards (moving from ceramic to composite), semiconductor chips that are inherently more fragile (due to their ever-reduced thickness) though with greater computing capability, finer pitch, increased density of solder ball placement and smaller diameter solder balls themselves, and increased reflow temperatures due to the conversion of leaded solders to lead free solders, greater stresses due to warpage and shock are observed in the semiconductor packages being designed today than ever before.

Conventional commercial underfill sealant materials, such as low coefficient of thermal expansion ("CTE"), high modulus, epoxy-based underfill sealant materials appear to be incapable of providing the necessary protection against package stresses to prevent damage to the fragile low-k ILD's. The low-k ILD's, being fragile in nature, are generally weaker and more brittle than conventional ILD materials, such as silicon oxides, silicon nitrides, fluorinated silicon glass, and the like, and as a result lead to fracture and cracks during thermal excursions due to induced stresses.

It would be desirable therefore to provide electronic packaging materials suitable for advanced applications, such as thermosetting resin compositions useful for FC underfill sealant materials, which are compatible for use with low-k ILD's and reduce the internal package stresses that lead to ILD cracking failures. In addition, it would be desirable to provide electronic packages assembled with such thermosetting resin compositions, provide methods of manufacturing such electronic packages that provide enhanced physical properties, and provide methods of providing thermosetting resin compositions having a physical property profile in terms of reduced modulus and CTE that make such compositions particularly attractive to high stress FC underfill sealant applications in semiconductor packaging.

SUMMARY OF THE INVENTION

Generally, the present invention provides for reduced internal package stresses on electronic packages, such as described below.

The stress reduction in a semiconductor package is achieved through the marrying of low modulus with low CTE. These physical properties have to date not been available in a FC underfill sealant material. Until now.

The present invention provides thermosetting resin compositions capable of significantly reducing internal stresses developed within semiconductor packages assembled with the low-K ILD's by exhibiting a modulus at room temperature in the range of 6,000 to 10,000 MPas, such as about 7000 MPa and 9000 MPa and a CTE $\alpha 1$ in the range of 7 to 20 ppm, such as about 10 and 20 ppm. This physical property combination in a FC underfill sealant material that is capable of curing and withstanding lead free solder reflow profiles, such as where the temperatures reach in the range of 240-260° C. over a 2-5 minute period of time, shows promise in overcoming one of the significant hurdles facing the semiconductor packaging industry at present.

These performance properties are particularly significant in semiconductor device packaging technology, such as where:

semiconductor chips with copper electrical interconnections and at least one layer of low-K ILD are used;

Semiconductor chips that are large sizes, typically more than 2.5 cm on a side semiconductor chips that are relatively thin, such as less than 100 microns, compared to that of the current nominal thickness of about 350 microns are used; and underfill layers that are relatively thin, such as less than 20 microns, compared to that of the current nominal bond line thickness ("BLT") of 75 microns are used.

When semiconductor chips with copper interconnection and at least one layer of low-K ILD are used, this performance property improves reliability (i.e., prevents cracking in the ILD) in the assembled semiconductor device. More specifically, in a flip chip package this performance property improves reliability when underfill sealant contacts the semiconductor chip constructed of copper interconnects and at least one layer of low-K ILD. In this way, the stresses on the semiconductor device are absorbed to a large extent by the underfill sealant, and thus the low-K ILD is preserved.

In addition, whether or not the low-K ILD's are used in the semiconductor package, the present invention also confers the noted benefits and advantage to semiconductor packages having very thin semiconductor chips (such as less than 100 microns) and underfill bond lines of less than 20 microns between the semiconductor chip and the circuit board.

The present invention thus provides in one aspect a thermosetting resin composition, whose components include an epoxy resin component, a silane modified epoxy, and a hardener, which may be a cyanate ester or an aromatic amine, together with an optional catalyst.

In another aspect, the present invention provides a method of improving reliability of an underfilled semiconductor device comprising at least one layer of low-k ILD. The steps of this method include:

providing a semiconductor device comprising:
 a semiconductor chip comprising copper electrical interconnections and at least one layer of low-K ILD therewithin; and
 a carrier substrate having electrical contact pads on a surface thereof to which the semiconductor chip is electrically interconnected;
providing a heat curable underfill composition between the electrically interconnected surfaces of the semiconductor chip and the carrier substrate to form a semiconductor device assembly; and
exposing the semiconductor device assembly to elevated temperature conditions sufficient to cure the heat curable underfill composition. The heat curable underfill composition as noted above includes an epoxy resin component, a silane modified epoxy, and a hardener, which may be a cyanate ester or an aromatic amine, together with an optional catalyst.

In one embodiment, after the semiconductor chip and the carrier substrate are mated the heat curable underfill composition is provided by dispensing and filling the space therebetween to form the semiconductor device.

In another embodiment, the heat curable underfill composition is provided by dispensing onto at least a portion of an electrically interconnecting surface of one or both of the semiconductor chip or the carrier substrate, and the semiconductor chip and the carrier substrate are then mated to form the semiconductor device.

In this aspect, a semiconductor device is also provided as a flip chip assembly and comprises:
 a semiconductor chip comprising copper electrical interconnections and at least one layer of low-K ILD therewithin;
 a circuit board having electrical contact pads on a surface thereof to which the semiconductor chip is electrically interconnected; and
 an underfill composition between the semiconductor chip and the circuit board. Here too the underfill composition includes an epoxy resin component, a silane modified epoxy, and a hardener, which may be a cyanate ester or an aromatic amine, together with an optional catalyst.

A semiconductor device assembly is also provided as a chip scale package and comprises:
 a semiconductor device comprising a semiconductor chip having copper electrical interconnections and at least one layer of low-k ILD therewithin, to which is electrically connected a carrier substrate;
 a circuit board having electrical contact pads on a surface thereof to which the semiconductor device is electrically interconnected; and
 an underfill composition between the semiconductor device and the circuit board. Here too the underfill composition includes an epoxy resin component, a silane modified epoxy, and a hardener, which may be a cyanate ester or an aromatic amine, together with an optional catalyst.

A method for assembling an integrated circuit assembly is also provided, steps of which include:
 providing an integrated circuit chip;
 joining the integrated circuit chip with a carrier substrate to form a mated assembly; and
 exposing the so-formed mated assembly to elevated temperature conditions sufficient to render the electrical contacts and cure the heat curable underfill composition, thereby establishing electrical interconnection in adhering the integrated circuit chip to the carrier substrate.

In these embodiments and aspects, the electrically conductive material may be solder, such as one of the following solder alloys: Sn(63):Pb(37), Pb(95):Sn(5), Sn:Ag(3.5):Cu (0.5) and Sn:Ag(3.3):Cu(0.7), or a combination of copper pillars and solder interconnection.

When semiconductor chips that are relatively thin, such as less than 100 microns, compared to that of the current nominal thickness of about 350 microns are used, this performance property improves reliability (i.e., prevents cracking in the low-K ILD or the semiconductor chip itself) in the assembled semiconductor device.

More specifically, in a flip chip package this performance property improves reliability as underfill sealant is intended to relieve die stresses, whether or not low-K ILD layer(s) are used in the package. Also, in a wire bonded die package this performance property improves reliability as die attach is intended to relieve die stresses, whether or not low-K ILD layer(s) are used in the package and whether or not a stacked die assembly is used.

When chip attachment layers that are relatively thin, such as less than 20 microns, compared to that of the current nominal BLT of 50 microns are used, this performance property improves reliability (i.e., reduces overall package stress and prevents cracking of the chip attachment layer) in the assembled semiconductor device.

DETAILED DESCRIPTION OF THE INVENTION

Figure 1:
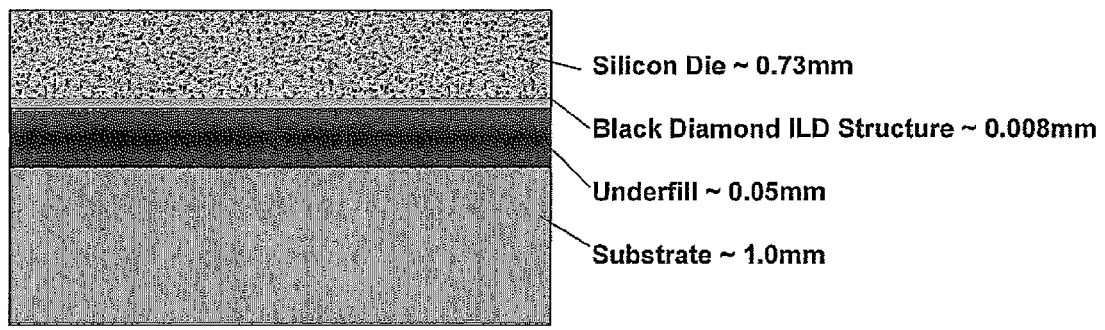
FIG. 1 depicts the separate components and physical dimensions of a conventional 0.130 um low-K die structure.
Figure 2:
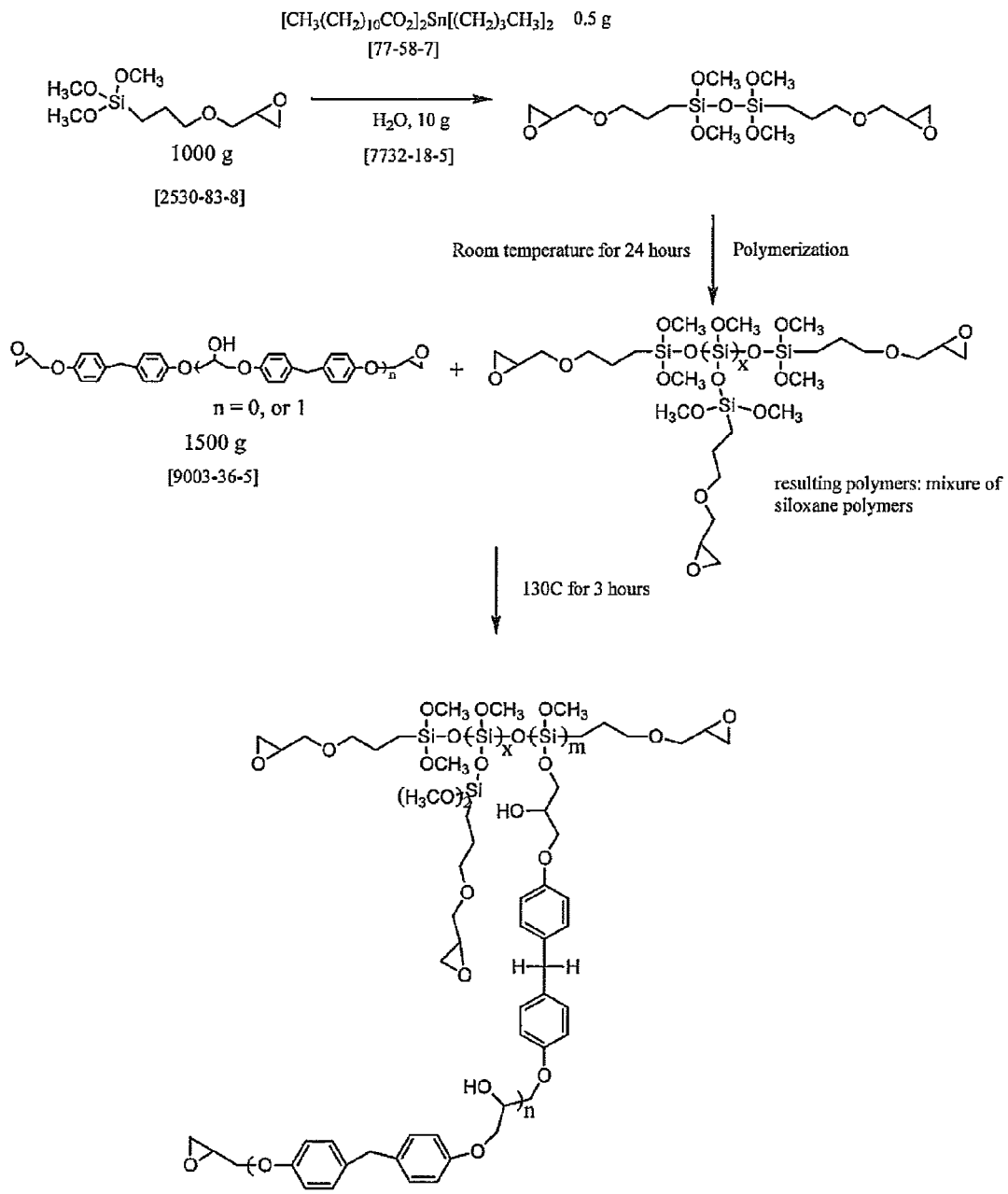
FIG. 2 depicts a synthetic scheme by which the silane modified epoxy discussed herein may be prepared.

The thermosetting resin compositions of the present invention, as noted above, include among other constituents an epoxy component. Examples of the epoxy component are given below.

For instance the epoxy component may include the combination of two or more different bisphenol based epoxies. These bisphenol based epoxies may be selected from bisphenol A, bisphenol F, or bisphenol S epoxies, or combinations thereof. In addition, two or more different bisphenol epoxies within the same type of resin (such A, F or S) may be used.

Commercially available examples of the bisphenol epoxies desirable for use herein include bisphenol-F-type epoxies (such as RE-404-S from Nippon Kayaku, Japan, and EPICLON 830 (RE1801), 8305 (RE1815), 830A (RE1826) and 830W from Dai Nippon Ink & Chemicals, Inc., and RSL 1738 and YL-983U from Resolution) and bisphenol-A-type epoxies (such as YL-979 and 980 from Resolution).

The bisphenol epoxies available commercially from Dai Nippon and noted above are promoted as liquid undiluted epichlorohydrin-bisphenol F epoxies having much lower viscosities than conventional epoxies based on bisphenol A epoxies and have physical properties similar to liquid bisphenol A epoxies. Bisphenol F epoxy has lower viscosity than bisphenol A epoxies, all else being the same between the two types of epoxies, which affords a lower viscosity and thus a fast flow underfill sealant material. The NEW of these four bisphenol F epoxies is between 165 and 180. The viscosity at 25° C. is between 3,000 and 4,500 cps (except for RE1801 whose upper viscosity limit is 4,000 cps). The hydrolyzable chloride content is reported as 200 ppm for RE1815 and 830W, and that for RE1826 as 100 ppm.

The bisphenol epoxies available commercially from Resolution and noted above are promoted as low chloride containing liquid epoxies. The bisphenol A epoxies have a EEW (g/eq) of between 180 and 195 and a viscosity at 25° C. of between 100 and 250 cps. The total chloride content for YL-979 is reported as between 500 and 700 ppm, and that for YL-980 as between 100 and 300 ppm. The bisphenol F epoxies have a EEW (g/eq) of between 165 and 180 and a viscosity at 25° C. of between 30 and 60. The total chloride content for RSL-1738 is reported as between 500 and 700 ppm, and that for YL-983U as between 150 and 350 ppm.

In addition to the bisphenol epoxies, other epoxy compounds are included within the epoxy component of the present invention. For instance, cycloaliphatic epoxies, such as 3,4-epoxycyclohexylmethyl-3,4-epoxycyclohexylcarbonate, are used. Also monofunctional, difunctional or multifunctional reactive diluents to adjust the viscosity and/or lower the Tg are also used, such as butyl glycidyl ether, cresyl glycidyl ether, polyethylene glycol glycidyl ether or polypropylene glycol glycidyl ether.

Among the epoxies suitable for use herein also include polyglycidyl derivatives of phenolic compounds, such as those available commercially under the tradename EPON, such as EPON 828, EPON 1001, EPON 1009, and EPON 1031 from Resolution; DER 331, DER 332, DER 334, and DER 542 from Dow Chemical Co.; and BREN-S from Nippon Kayaku. Other suitable epoxies include polyepoxides prepared from polyols and the like and polyglycidyl derivatives of phenol-formaldehyde novolacs, the latter of such as DEN 431, DEN 438, and DEN 439 from Dow Chemical. Cresol analogs are also available commercially under the tradename ARALDITE, such as ARALDITE ECN 1235, ARALDITE ECN 1273, and ARALDITE ECN 1299 from Ciba Specialty Chemicals Corporation. SU-8 is a bisphenol-A-type epoxy novolac available from Resolution. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE 0500, and ARALDITE 0510 from Ciba Specialty Chemicals and PGA-X and PGA-C from the Sherwin-Williams Co.]]

Appropriate monofunctional epoxy coreactant diluents for use herein include those that have a viscosity which is lower than that of the epoxy component, ordinarily, less than about 250 cps.

The monofunctional epoxy coreactant diluents should have an epoxy group with an alkyl group of about 6 to about 28 carbon atoms, examples of which include $C_{6-28}$ alkyl glycidyl ethers, $C_{6-28}$ fatty acid glycidyl esters and $C_{6-28}$ alkylphenol glycidyl ethers.

In the event such a monofunctional epoxy coreactant diluents is included, such coreactant diluent should be employed in an amount of up to about 5 percent by weight to about 15 percent by weight, such as about 8 percent by weight to about 12 percent by weight, based on the total weight of the composition.

The epoxy component should be present in the composition in an amount which the range of about 10 percent by weight to about 95 percent by weight, desirably about 20 percent by weight to about 80 percent by weight, such as about 60 percent by weight.

The silane modified epoxy is a composition of matter that includes:

As component (A) an epoxy component embraced by the following structure:

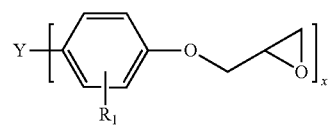

where Y may or may not be present and when Y present is a direct bond, $CH_2$, $CH(CH_3)_2$, $C=O$, or S, $R_1$ here is alkyl, alkenyl, hydroxy, carboxy and halogen, and x here is 1-4;

As component (B) an epoxy-functionalized alkoxy silane embraced by the following structure:

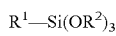

where $R^1$ is an oxirane-containing moiety and $R^2$ is an alkyl or alkoxy-substituted alkyl, aryl, or aralkyl group having from one to ten carbon atoms; and As component (C) reaction products of components (A) and (B).

An example of one such silane-modified epoxy is formed as the reaction product of an aromatic epoxy, such as a bisphenol A, E, F or S epoxy or biphenyl epoxy, and epoxy silane where the epoxy silane is embraced by the following structure:

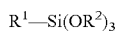

where $R^1$ is an oxirane-containing moiety, examples of which include 2-(ethoxymethyl)oxirane, 2-(propoxymethyl)oxirane, 2-(methoxymethyl)oxirane, and 2-(3-methoxypropyl)oxirane and $R^2$ is an alkyl or alkoxy-substituted alkyl, aryl, or aralkyl group having from one to ten carbon atoms. In one embodiment, $R^1$ is 2-(ethoxymethyl)oxirane and $R^2$ is methyl.

Idealized structures of the aromatic epoxy used to prepare the silane modified epoxy include

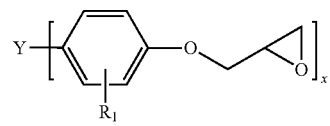

where Y may or may not be present and when Y present is a direct bond, $CH_2$, $CH(CH_3)_2$, $C=O$, or S, $R_1$ here is alkyl, alkenyl, hydroxy, carboxy and halogen, and x here is 1-4. Of course, when x is 2-4, chain extended versions of the aromatic epoxy are also contemplated as being embraced by this structure.

For instance, a chain extended version of the aromatic epoxy may be embraced by the structure below

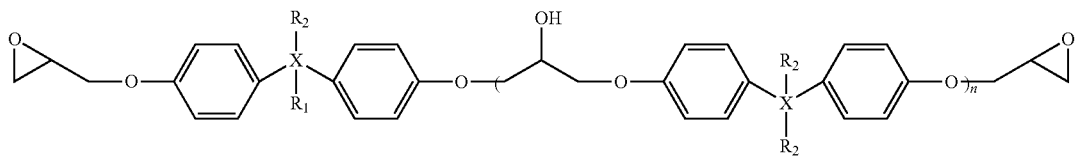

The silane modified epoxy may also be a combination of the aromatic epoxy, the epoxy silane, and reaction products of the aromatic epoxy and the epoxy silane. The reaction products may be prepared from the aromatic epoxy and epoxy silane in a by weight ratio of 1:100 to 100:1, such as a by weight ratio of 1:10 to 10:1.

As the catalyst, many different materials can be used depending upon the temperature at which cure is desired to occur. For instance to achieve cure at a temperature in the about 150° C. to about 180° C. range, a variety of other materials may be used. For instance, an imidazole might be used with aromatic amine hardener, or a metal salt such as copper or cobalt acetyl acetonate might be used with cyanate ester hardener.

When present, the catalyst should be present in an amount with the range of about 0.05 percent by weight to about 1 percent by weight, desirably about 0.1 percent by weight to about 0.5 percent by weight, of the total composition.

As a hardener, a cyanate ester or an aromatic amine may be used. Examples of the cyanate ester include aryl compounds having at least one cyanate ester group on each molecule and may be generally represented by the formula $Ar(OCN)_m$, where m is an integer from 2 to 5 and Ar is an aromatic radical. The aromatic radical Ar should contain at least 6 carbon atoms, and may be derived, for example, from aromatic hydrocarbons, such as benzene, biphenyl, naphthalene, anthracene, pyrene or the like. The aromatic radical Ar may also be derived from a polynuclear aromatic hydrocarbon in which at least two aromatic rings are attached to each other through a bridging group. Also included are aromatic radicals derived from novolac-type phenolic resins—i.e., cyanate esters of these phenolic resins. The aromatic radical Ar may also contain further ring-attached, non-reactive substituents.

Examples of such cyanate esters include, for instance, 1,3-dicyanatobenzene; 1,4-dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanato-biphenyl; bis(4-cyanatophenyl)methane and 3,3',5,5'-tetramethyl bis(4-cyanatophenyl)methane; 2,2-bis(3,5-dichloro-4-cyanatophenyl)propane; 2,2-bis(3,5-dibromo-4-dicyanatophenyl)propane; bis(4-cyanatophenyl)ether; bis(4-cyanatophenyl)sulfide; 2,2-bis(4-cyanatophenyl)propane; tris(4-cyanatophenyl)-phosphite; tris(4-cyanatophenyl)phosphate; bis(3-chloro-4-cyanatophenyl)methane; cyanated novolac; 1,3-bis[4-cyanatophenyl-1-(methylethylidene)]benzene and cyanated bisphenol-terminated polycarbonate or other thermoplastic oligomer.

Other cyanate esters include cyanates disclosed in U.S. Pat. Nos. 4,477,629 and 4,528,366, the disclosure of each of which is hereby expressly incorporated herein by reference; the cyanate esters disclosed in U.K. Pat. No. 1,305,702, and the cyanate esters disclosed in International Patent Publication WO 85/02184, the disclosure of each of which is hereby expressly incorporated herein by reference. Of course, combinations of these cyanate esters within the imidizole component of the compositions of the present invention are also desirably employed herein.

A particularly desirable cyanate ester for use herein is available commercially from Ciba Speciality Chemicals, Tarrytown, N.Y. under the tradename AROCY 366 (1,3-bis[4-cyanatophenyl-1-(methylethylidene)]benzene). The structures of four other desirable "AROCY" cyanate esters are

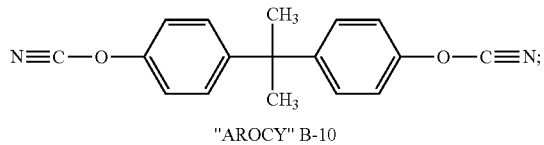
"AROCY" B-10

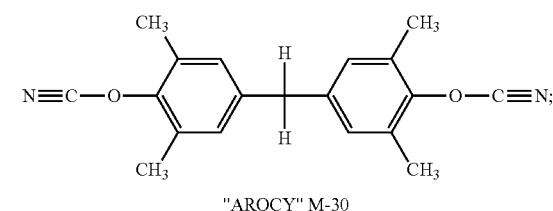
"AROCY" M-30

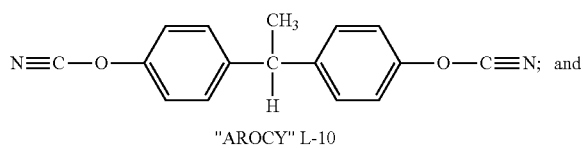 and
"AROCY" L-10

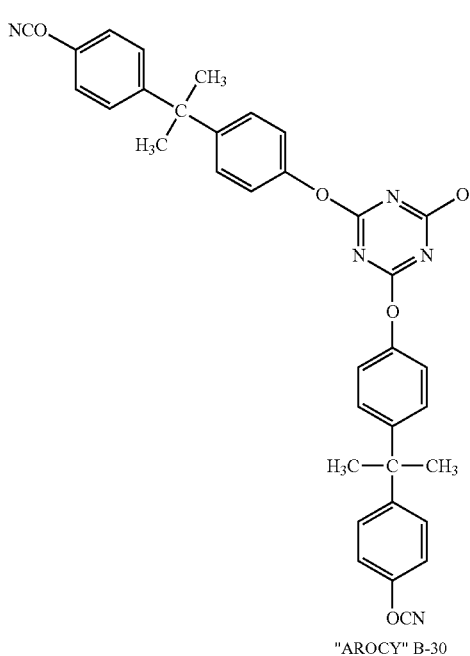

"AROCY" B-30

Examples of the aromatic amine include 3-aminophenylsulfone, 4-amino phenyl sulfone, and 4,4-methylenebis(o-ethylaniline), the latter of which is known commercially Acetocure MBOEA.

The hardener should be present in an amount of 10 to 50% of the resin composition.

As a filler component, when used, many materials are potentially useful. For instance, inorganic fillers may be useful, particularly where coefficients of thermal expansion ("CTE") between the semiconductor chip and the substrate to be mated and sealed are to be more closely matched. The filler influences the CTE and thus can be used to reduce thermal expansion of the cured material, thereby reducing warpage. The filler component may often include reinforcing silicas, such as fused spherical silicas, and may be untreated or treated so as to alter the chemical nature of their surface. The filler component however should include particles having a mean particle size distribution in the 0.1 to 50 micron range. A commercially available example of such particles is sold by Tatsumori or Denka in Japan. In addition, nano-size silica powder might be added, such as those sold under the tradename NANOPDX by Nanoresins, Germany. NANOPDX fillers are monodisperse silica filler dispersions in epoxy resins, at a level of up to about 50 percent by weight, available from Nanoresins, Germany. NANOPDX fillers ordinarily are believed to have a particle size of about 5 nm to about 80 nm.

Nanoresins also produces materials under the NANOPDX E trade designations. For instance, Nanoresins reports NANOPDX E-brand products enable the complete impregnation of electronic components which are difficult to seal otherwise and provide a large spectrum of mechanical and thermal properties such as reduced shrinkage and thermal expansion, fracture toughness and modulus. In Table 1 below, Nanoresin provides information on the four noted NANOPDX E products:

TABLE 1

| Type | SiO2-Content [wtpercent] | Base resine | EEW [g/quiv.] | Dyn. viscosity, 25° C. [mPa · s] | Characterization |
|---|---|---|---|---|---|
| NANOPOX E 430 | 40 | DGEBA/ DGEBF | 290 | 45,000 | no crystallization |
| NANOPOX E 470 | 40 | DGEBA | 295 | 60,000 | basic type |
| NANOPOX E 500 | 40 | DGEBF | 275 | 20,000 | low viscous |
| NANOPOX E 600 | 40 | EEC 1 | 220 | 4,000 | cycloaliphatic formulations |

1 3,4-epoxycyclohexylmethyl-3,4-epoxycyclohexylcarbonate

Nanoresins reports that important properties can be significantly improved in epoxy formulations by using NANOPDX E-brand products. For instance:
 lower viscosity of the formulation in comparison to conventional reinforced fillers
 no sedimentation
 increase in the fracture toughness, impact resistance and modulus
 improved scratch and abrasion resistance
 reduction of shrinkage and thermal expansion
 improvement, or at least no negative effect, in numerous desired properties, such as thermal stability, chemical resistance, glass transition temperature, weathering resistance, and dielectric properties.

The processability remains essentially unchanged in comparison to the respective base resin.

NANOPDX E is used in applications where the above improvements to properties are desired or necessary, without compromising the processability by an excessive increase in viscosity (known from fumed silica). Application examples are encapsulation materials and coatings. It is important to emphasize the excellent impregnation properties of NANOPDX E due to the small particle size and the absence of agglomerates. This also enables the complete impregnation of electronic components which are difficult to seal otherwise.

According to the manufacturer, NANOPDX E-brand products are a colloidal silica sol in an epoxy resin matrix. The disperse phase consists according to the manufacturer of surface-modified, spherically shaped $SiO_2$ nanoparticles with diameters below 50 nm and an extremely narrow particle size distribution. These spheres, only a few nanometers in size, are distributed agglomerate-free in the resin matrix. This according to the manufacturer produces a very low viscosity of the dispersion with $SiO_2$ content of up to 40 percent by weight. As reported by the manufacturer, the nanoparticles are chemically synthesized from aqueous sodium silicate solution. In this process the binding agent is not damaged, in contrast to processes in which powdered fillers are dispersed with dissolvers or other equipment using high shear energy.

Other desirable materials for use as a filler component include those constructed of or containing aluminum oxide, silicon nitride, aluminum nitride, silica-coated aluminum nitride, boron nitride and combinations thereof.

The filler component, when used, should be used in an amount of about 10 to about 80 percent by weight of the composition, such as about 12 to about 60 percent by weight, desirably within the range of about 15 to about 35 percent by weight.

EXAMPLES

Sample Nos. 1-20 are set forth below in Tables 1a-1b and 2a-2b.

TABLE 1a

| Constituents | | Sample Nos./Amt. (wt %) | | | | |
| --- | --- | --- | --- | --- | --- | --- |
| Type | Identity | 1 | 2 | 3 | 4 | 5 |
| Epoxy | Bisphenol F Epoxy | 80 | 56 | 48 | 40 | 24 |

TABLE 1a-continued

| Constituents | | Sample Nos./Amt. (wt %) | | | | |
| --- | --- | --- | --- | --- | --- | --- |
| Type | Identity | 1 | 2 | 3 | 4 | 5 |
| Hardener | Bisphenol E Dicyanate | — | — | — | — | — |
| | Benzenamine, 4,4 methylene bis(2-ethyl-) | 20 | 14 | 12 | 10 | 6 |
| Catalyst | Cobalt Acetyl Acetonate | — | — | — | — | — |
| Filler | Fused silica | 0 | 30 | 40 | 50 | 70 |

TABLE 1b

| Constituents | | Sample Nos./Amt. (wt %) | | | | |
| --- | --- | --- | --- | --- | --- | --- |
| Type | Identity | 6 | 7 | 8 | 9 | 10 |
| Epoxy | Bisphenol F Epoxy | 60 | 42 | 36 | 30 | 18 |
| Hardener | Bisphenol E Dicyanate | 40 | 28 | 24 | 20 | 12 |
| | Benzenamine, 4,4 methylene bis(2-ethyl-) | — | — | — | — | — |
| Catalyst | Cobalt Acetyl Acetonate | 0.001 | 0.001 | 0.001 | 0.001 | 0.001 |
| Filler | Fused silica | 0 | 30 | 40 | 50 | 70 |

TABLE 2a

| Constituents | | Sample Nos./Amt. (wt %) | | | | |
| --- | --- | --- | --- | --- | --- | --- |
| Type | Identity | 11 | 12 | 13 | 14 | 15 |
| Silane Modified Epoxy | Silane modified Bisphenol F Epoxy | 80 | 40 | 24 | 18 | 18 |
| Epoxy | Bisphenol F Epoxy | — | — | — | 6 | — |
| | Triphenylmethane triglycidyl ether (Tactix 742) | — | — | — | — | — |
| | Oxirane, 2,2(1,6 naphthylene ethyl bis-oxymethylene)bis- | — | — | — | — | 6 |
| Hardener | Bisphenol E Dicyanate | — | — | — | — | — |
| | Benzenamine, 4,4 methylene bis(2-ethyl-) | 20 | 10 | 6 | 6 | 6 |
| Catalyst | Cobalt Acetyl Acetonate | — | — | — | — | — |
| | p-Octyloxyphenylphenyliodonium hexafluoroantimonate | — | — | — | — | — |
| Filler | Fused silica | 0 | 50 | 70 | 70 | 70 |

TABLE 2b

| Constituents | | Sample Nos./Amt. (wt %) | | | | |
| --- | --- | --- | --- | --- | --- | --- |
| Type | Identity | 16 | 17 | 18 | 19 | 20 |
| Silane Modified Epoxy | Silane modified Bisphenol F Epoxy | 14 | 22 | 18 | 12 | 12 |
| Epoxy | Bisphenol F Epoxy | — | — | — | — | — |
| | Triphenylmethane triglycidyl ether (Tactix 742) | 4 | — | — | — | — |
| | Oxirane, 2,2(1,6 naphthylene ethyl bis-oxymethylene)bis- | 6 | 8 | — | — | 6 |
| Hardener | Bisphenol E Dicyanate | — | — | 12 | 8 | 12 |
| | Benzenamine, 4,4 methylene bis(2-ethyl-) | 6 | — | — | — | — |

TABLE 2b-continued

| Constituents | | Sample Nos./Amt. (wt %) | | | | |
|---|---|---|---|---|---|---|
| Type | Identity | 16 | 17 | 18 | 19 | 20 |
| Catalyst | Cobalt Acetyl Acetonate | — | — | 0.001 | 0.001 | 0.001 |
| | p-Octyloxyphenylphenyliodonium hexafluoroantimonate | — | 0.03 | — | — | — |
| Filler | Fused silica | 70 | 70 | 70 | 80 | 70 |

The compositions were each prepared by mixing together the epoxy constituents with a mechanical mixer until dissolution to a homogeneous solution was observed. The silica filler was then added with continued mixing for a period of time of about 30-60 minutes at room temperature until a viscous paste with a substantially uniform consistency was achieved. The so formed pastes were then transferred into containers until ready for use. Mechanical properties such as modulus, glass transition temperature, coefficient of thermal expansion were measured after the samples were cured for a period of time of 2 hours at a temperature of 175° C. in an oven.

Physical properties for these samples are shown in Tables 3a-3b and 4a-4b.

TABLE 3a

| | Sample Nos. | | | | |
|---|---|---|---|---|---|
| Physical Properties | 1 | 2 | 3 | 4 | 5 |
| Viscosity, cps | 3000 | 6000 | 10000 | 22000 | 41000 |
| Cured Modulus @RT, Mpa | 2500 | 4350 | 6000 | 9500 | 14900 |
| Cured Modulus @150° C., Mpa | 150 | 250 | 320 | 400 | 650 |
| CTE $\alpha_1$ (ppm) | 60 | 47 | 36 | 25 | 20 |
| CTE $\alpha_2$ (ppm) | 150 | 140 | 125 | 110 | 90 |
| $T_g$, ° C. | 120 | 120 | 120 | 120 | 120 |

TABLE 3b

| | Sample Nos. | | | | |
|---|---|---|---|---|---|
| Physical Properties | 6 | 7 | 8 | 9 | 10 |
| Viscosity, cps | 1500 | 3500 | 5200 | 6500 | 18000 |
| Cured Modulus @RT, Mpa | 3800 | 7000 | 8500 | 11000 | 16000 |
| Cured Modulus @150 C., Mpa | 1200 | 2400 | 3200 | 4000 | 5200 |
| CTE $\alpha_1$ (ppm) | 47 | 36 | 28 | 20 | 16 |
| CTE $\alpha_2$ (ppm) | 75 | 70 | 60 | 55 | 45 |
| $T_g$, ° C. | 160 | 160 | 160 | 160 | 160 |

TABLE 4a

| | Sample Nos. | | | | |
|---|---|---|---|---|---|
| Physical Properties | 11 | 12 | 13 | 14 | 15 |
| Viscosity, cps | 600 | 1200 | 2500 | 6000 | 6500 |
| Cured Modulus @RT, Mpa | 1500 | 3200 | 5000 | 5500 | 5200 |
| Cured Modulus @150° C., Mpa | 15 | 40 | 50 | 80 | 80 |
| CTE $\alpha_1$ (ppm) | 60 | 25 | 20 | 20 | 16 |
| CTE $\alpha_2$ (ppm) | 174 | 150 | 125 | 120 | 125 |
| $T_g$, ° C. | 80 | 80 | 80 | 85 | 90 |

TABLE 4b

| | Sample Nos. | | | | |
|---|---|---|---|---|---|
| Physical Properties | 16 | 17 | 18 | 19 | 20 |
| Viscosity, cps | 9500 | 8000 | 1600 | 9000 | 12000 |
| Cured Modulus @RT, Mpa | 6000 | 5000 | 6000 | 9500 | 5500 |
| Cured Modulus @150° C., Mpa | 90 | 150 | 240 | 400 | 250 |
| CTE $\alpha_1$ (ppm) | 16 | 15 | 15 | 11 | 15 |
| CTE $\alpha_2$ (ppm) | 120 | 110 | 60 | 35 | 50 |
| $T_g$, ° C. | 102 | 105 | 110 | 110 | 130 |

Figure 3:
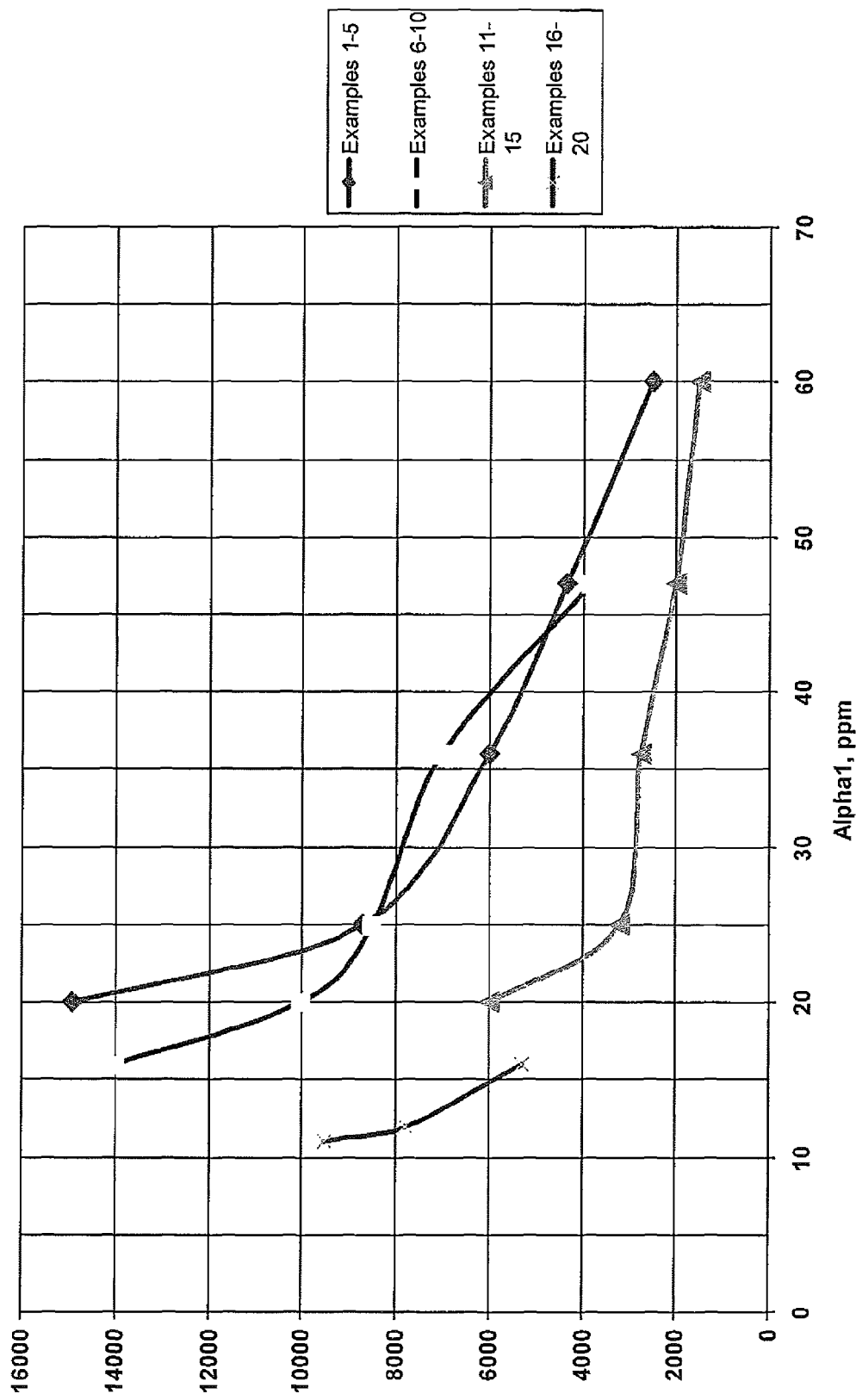
FIG. 3 depicts a modulus vs. CTE curve at room temperature of heat curable compositions within the scope of the invention (Sample Nos. 16-20), and a series of control compositions (Sample Nos. 1-15).

The physical properties [such as modulus, coefficients of thermal expansion ("CTE"), $\alpha_1$ and $\alpha_2$, and glass transition temperature ("Tg")] of the control compositions—Sample Nos. 1-5 (Tables 1a and 3a) and Sample Nos. 6-10 (Tables 1b and 3b)—are compared against the compositions of this invention—Sample Nos. 11-15 (Tables 2a and 4a) and in Sample Nos. 16-20 (Tables 2b and 4b). The functional relationship between modulus and CTE $\alpha_1$ values for all compositions when cured as described above is illustrated graphically in FIG. 3. In general, one can see the modulus range of Sample Nos. 11-15 and 16-20 is lower than that compared to the modulus range of Sample Nos. 1-5 and 6-10, while the CTE $\alpha_1$ values (and Tg, for that matter) remain in the same range. This combination of low modulus and low CTE $\alpha_1$ (and relatively high Tg) is a significant physical property combination for electronic materials, such as underfill sealants, for use in low k IC microelectronic devices.

What is claimed is:

1. A thermosetting resin composition, comprising:
    as a curable component a silane modified epoxy component, wherein the silane modified epoxy component comprises 10 up to 95 wt % of the total composition,
    a hardener, wherein the hardener is a cyanate ester or an aromatic amine,
    silica filler and optionally, a catalyst,
    wherein the silane modified epoxy component is a pre-mix comprising:
        As component (A) an epoxy embraced by the following structure:

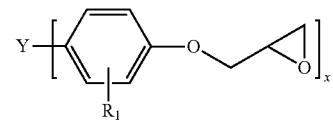

wherein:
    Y may or may not be present and when present, Y is a direct bond, $CH_2$, $CH(CH_3)_2$, $C=O$, or S,
    $R_1$ here is alkyl, alkenyl, hydroxy, carboxy or halogen, and x here is 1-4;

As component (B) an epoxy-functionalized alkoxy silane embraced by the following structure:

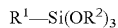

wherein:
R$^1$ here is an oxirane-containing moiety and
R$^2$ is an alkyl or alkoxy-substituted alkyl, aryl, or aralkyl group having from one to ten carbon atoms; and
As component (C) reaction products of components (A) and (B), and
wherein when cured as an underfill sealant the composition exhibits a modulus at room temperature in the range of 6,000 to 10,000 MPas and a CTE α1 in the range of 7 to 20 ppm.

2. A method of improving reliability of a semiconductor device comprising at least one layer of low-K ILD, steps of which comprise:
providing a semiconductor device comprising:
a semiconductor chip comprising copper electrical interconnections and at least one layer of low-K ILD therewithin and metallization on a surface thereof; and
a carrier substrate having electrical contact pads on a surface thereof to which the semiconductor chip is electrically interconnected through an electrically conductive material to the copper electrical interconnections;
providing a thermosetting resin composition according to claim 1 between the electrically interconnected surfaces of the semiconductor chip and the carrier substrate to form a semiconductor device assembly; and
exposing the semiconductor device assembly to elevated temperature conditions sufficient to cure the thermosetting resin composition.

3. The method of claim 2, wherein after the semiconductor chip and the carrier substrate are mated the thermosetting resin composition is provided by dispensing and filling the space therebetween to form the semiconductor device.

4. The method of claim 2 wherein the thermosetting resin composition is provided by dispensing onto at least a portion of an electrically interconnecting surface of one or both of the semiconductor chip or the carrier substrate, and the semiconductor chip and the carrier substrate are then mated to form the semiconductor device.

5. The method of claim 2, wherein the carrier substrate is a circuit board.

6. The method of claim 2, wherein the electrically conductive material is solder.

7. The method of claim 2, wherein the solder is selected from the group consisting of Sn(63):Pb(37), Pb(95):Sn(5), Sn:Ag(3.5):Cu(0.5) and Sn:Ag(3.3):Cu(0.7), or copper pillars-solder interconnect.

8. A semiconductor device comprising:
a semiconductor chip comprising copper electrical interconnections and the layer of low-K ILD therewithin and metallization on a surface thereof;
a circuit board having electrical contact pads on a surface thereof to which the semiconductor chip is electrically interconnected; and
a thermosetting resin composition according to claim 1 between the semiconductor chip and the circuit board.

9. A semiconductor device assembly comprising:
a semiconductor device comprising a semiconductor chip comprising copper electrical interconnections thereof contacting at least one layer of low-K ILD therewithin, therewithin and metallization on a surface thereof to which is electrically connected a carrier substrate;
a circuit board having electrical contact pads on a surface thereof to which the semiconductor device is electrically interconnected; and
a thermosetting resin composition according to claim 1 between the semiconductor device and the circuit board.

10. The composition of claim 1, wherein component (C) is made from components (A) and (B) in a weight ratio of 1:100 to 100:1.

11. The composition of claim 1, wherein component (C) is made from components (A) and (B) in a weight ratio of 1:10 to 10:1.

12. The composition of claim 1 wherein when cured as an underfill sealant the composition exhibits a modulus at room temperature in the range of 7,000 to 9,000 MPas.

13. The composition of claim 1 wherein when cured as an underfill sealant the composition exhibits a CTE α1 in the range of 10 to 20 ppm.

14. The composition of claim 1 wherein the hardener is a cyanate ester.

15. The composition of claim 1 wherein the hardener is an aromatic amine.

16. The composition of claim 1 wherein the hardener comprises 10 up to 50 wt % of the total composition.

17. The composition of claim 1 wherein the filler comprises 10 up to 80 wt % of the total composition.

* * * * *